United States Patent [19]

Fukunaga

[11] Patent Number: 5,602,866
[45] Date of Patent: Feb. 11, 1997

[54] SEMICONDUCTOR LASER

[75] Inventor: Toshiaki Fukunaga, Kanagawa-ken, Japan

[73] Assignee: Fuji Photo Film Co., Ltd., Kanagawa, Japan

[21] Appl. No.: 325,592

[22] Filed: Oct. 19, 1994

[30] Foreign Application Priority Data

Nov. 30, 1993  [JP]  Japan .................................. 5-299555

[51] Int. Cl.$^6$ ........................................................ H01S 3/08
[52] U.S. Cl. ................................. 372/96; 372/102; 372/45
[58] Field of Search ................................. 372/96, 102, 43, 372/45

[56] References Cited

U.S. PATENT DOCUMENTS

| | | | |
|---|---|---|---|
| 4,744,089 | 5/1988 | Montroll et al. ........................... | 372/96 |
| 4,852,116 | 7/1989 | Takiguchi et al. ......................... | 372/96 |
| 4,984,243 | 1/1991 | Kaganawa et al. ........................ | 372/96 |
| 5,007,107 | 4/1991 | Takiguchi et al. ......................... | 372/96 |
| 5,222,090 | 6/1993 | Serreze ..................................... | 372/45 |
| 5,303,255 | 4/1994 | Kudo et al. ................................ | 372/96 |

OTHER PUBLICATIONS

Waynant et al, Electro–optics Handbook, McGraw–Hill, Inc., 1994, p. 27.16.

"Gain–Coupled DFB Laser Diode Using Novel Absorptive Conduction–Type–Inverted Grating", Conference Digest on 13th IEEE International Semiconductor Laser Conference, Sep. 21–25, 1992, pp. 14–15.

Primary Examiner—Rodney B. Bovernick
Assistant Examiner—Yisun Song
Attorney, Agent, or Firm—Sughrue, Mion, Zinn, Macpeak & Seas

[57] ABSTRACT

In a semiconductor laser, lower layers (an optical waveguide and a carrier blocking layer), which are exposed to air after they have been etched to form diffraction gratings until crystals are regrown, are formed of a five-element AlGaIn-AsP-based compound semiconductor material. Thus, a semiconductor laser is obtained which has a high yield and the oscillation wavelength range of 740–1000 nm and maintains a high reliability over a long period of time.

3 Claims, 4 Drawing Sheets

SEMICONDUCTOR LASER

BACKGROUND OF THE INVENTION

1. Field of the Invention

The present invention relates to semiconductor lasers, and more particularly to semiconductor lasers such as a distributed feedback laser (a DFB laser) that incorporates diffraction gratings inside thereof.

2. Description of the Prior Art

For example, various types of semiconductor lasers, such as a DFB laser or a distributed Bragg reflection laser (a DBR laser), which incorporate diffraction gratings are known. In these types of semiconductor lasers, a number of lower layers such as a cladding layer, an active layer and an optical waveguide are formed on a substrate by a first stage of crystal growth. The upper side of these lower layers are periodically etched to a predetermined depth, whereby diffraction gratings are formed. A number of upper layers, such as an optical waveguide layer and a cladding layer, are formed by regrowing crystals.

One example of a DFB laser (an oscillation wavelength of 740–1000 nm) manufactured in the manner as mentioned above is disclosed in Conference Digest on 13th IEEE International Semiconductor Laser Conference, Sep. 21–25, 1992, pp. 14 –15. In this DFB laser, an n-type $Al_xGa_{1-x}As$ (X=0.45) cladding layer, an undoped GaAs active layer, a p-type $Al_xGa_{1-x}As$ (X–0.45) carrier blocking layer, a p- type $Al_xGa_{1-x}As$ (X =0.3) optical waveguide layer, and an n-type GaAs light absorption layer are successively grown on an n-type GaAs substrate. The layers are etched from the light absorption layer into the carrier blocking layer using lithography and dry etching techniques, so that predetermined three-dimensional diffraction gratings are formed. A p-type $Al_xGa_{1-x}As$ (X=0.25) optical waveguide layer, a p-type $Al_xGa_{1-x}As$ (X=0.45) cladding layer, and a p-type GaAs cap layer are formed over the light absorption layer by a second stage of crystal growth.

In such a conventional semiconductor laser, aluminum (Al), which is susceptible to oxidation, is included in high proportion in the lower layers such as a carrier blocking layer or the like. These lower layers are exposed to air before crystals are regrown by etching to form diffraction gratings. For this reason, the semiconductor laser has shown a failure caused by the occurrence of crystal defects. The increase of the composition of aluminum is intended to improve the characteristics of the semiconductor laser. Generally, in conventional semiconductor lasers, the content of aluminum in the group III elements is more than 30%.

Moreover, when the oscillation wavelength is set to a shorter wavelength side, for example, below 800 nm in the range of 740–1000 nm, the composition of aluminum in each layer should be increased. However, in such a case, it becomes difficult to obtain reliability over a long period of time under high output oscillation conditions.

SUMMARY OF THE INVENTION

In view of the foregoing observations, the object of this invention is to provide a semiconductor laser that can be manufactured with high yield by the elimination of crystal defects occurring during the regrowth of crystals, and that maintains high reliability over a long period of time even when the laser is subjected to high output oscillations.

To this end, according to one aspect of the present invention, there is obtained a semiconductor laser comprising:

a number of lower layers which are formed on a GaAs substrate by a first stage of crystal growth;

diffraction gratings which are formed by periodically etching an upper side of the lower layers to a predetermined depth; and a number of upper layers which are formed by regrowing crystals over the diffraction gratings, wherein the lower layers which are subjected to etching are composed of a five-element AlGaInAsP-based compound semiconductor material.

When compared with other compound semiconductors including aluminum, the five-element AlGaInAsP-based compound semiconductor enables a semiconductor laser having superior characteristics to be formed even when the content of aluminum is reduced. Similarly, when lower layers subjected to etching (that is, lower layers disposed on the uppermost position which directly come into contact with air, or which are exposed to air from etched trenches) are formed using the compound semiconductor having the lower aluminum content, which is susceptible to oxidation, the oxidation becomes less likely to occur. Crystal defects at the time of regrowth of crystals caused by the oxidation of aluminum are reduced, and hence it becomes possible to manufacture a semiconductor laser with diffraction gratings with high yield.

By the use of the foregoing AlGaInAsP-based compound semiconductor, the content of aluminum in the vicinity of the active layer is reduced, and hence catastrophic optical damages of the facets become less likely to occur. As a result of this, the reliability of this semiconductor laser is high over a long period of time even when being subjected to high output oscillations.

When the lower layers which will be subjected to etching are made of the AlGaInAsP-based compound semiconductor having the lower aluminum content, the selective buried epitaxial growth which is required to confine transverse modes can be easily realized even by the use of metalorganic vapor phase epitaxy. Accordingly, the semiconductor laser according to this invention is easily applicable to various types of refractive index waveguide type semiconductor lasers as well as optical integrated circuits consisting of a semiconductor laser, an optical modulator, an optical amplifier and electronic circuits.

BRIEF DESCRIPTION OF THE DRAWINGS

In the accompanying drawings.

DESCRIPTION OF THE PREFERRED EMBODIMENTS

The present invention will be described in detail on the basis of embodiments shown in the accompanying drawings. FIGS. 1–4 illustrate steps of manufacturing a DFB laser according to a first embodiment of the present invention in the order in which it is manufactured. With reference to these drawings, the first embodiment will now be described. Throughout the following description of preferred embodiments, all AlGaInAsP layers are lattice-matched to a GaAs Substrate unless otherwise specified.

Figure 1:
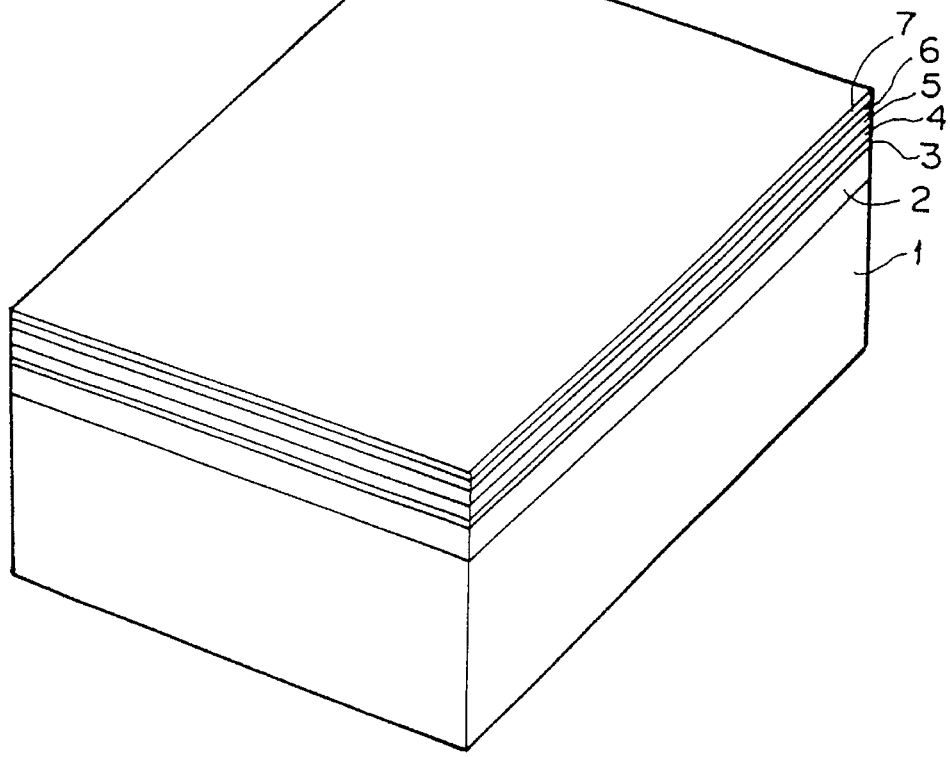
FIG. 1 is a schematic representation illustrating one step of manufacturing a DFB laser according to a first embodiment of the present invention.

As shown in FIG. 1, an n-type AlGaInAsP cladding layer which has a bandgap $E_{gC}$, an undoped GaInAsP active layer 3 having a bandgap $E_{gA}$ ($E_{gC} > E_{gA}$), a p-type AlGaInAsP carrier blocking layer 4 having a bandgap $E_{gC}$, a p-type AlGaInAsP optical waveguide layer 5 having a bandgap $E_{gG}$ ($E_{gC} > E_{gG} > E_{gA}$), and an n-type GaAs light absorption layer 6, are successively grown on an n-type GaAs (100) substrate 1 by either organometallic vapor phase epitaxy or molecular beam epitaxy. Moreover, a resist 7 having a thickness of about 0.1 μm is applied over the light absorption layer 6.

Figure 2:
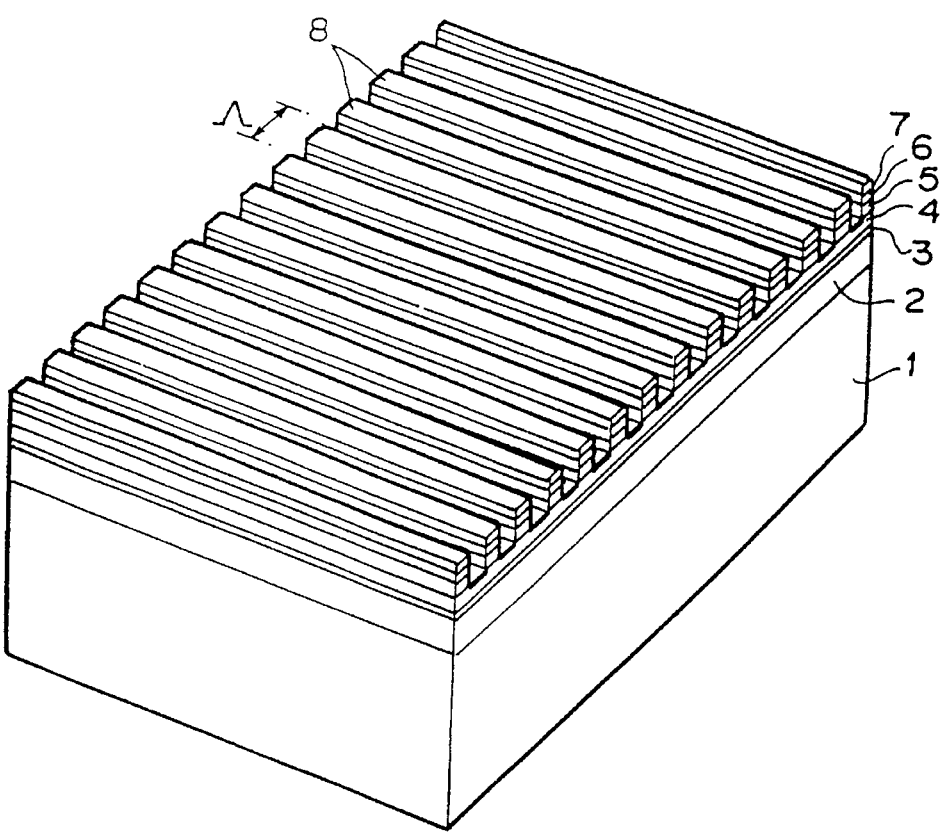
FIG. 2 is a schematic representation illustrating a step subsequent to the step shown in FIG. 1.

As shown in FIG. 2, to form diffraction gratings 8 having a predetermined period Λ which is determined by an oscillation wavelength, the resist 7 is periodically removed from the regions which are about half of the period Λ, after the lower layers 2–6 have been formed in the manner as mentioned above using photolithography which employs normal interference exposure. Trenches are formed by dry etching using the remaining resist 7 as a mask.

Figure 3:
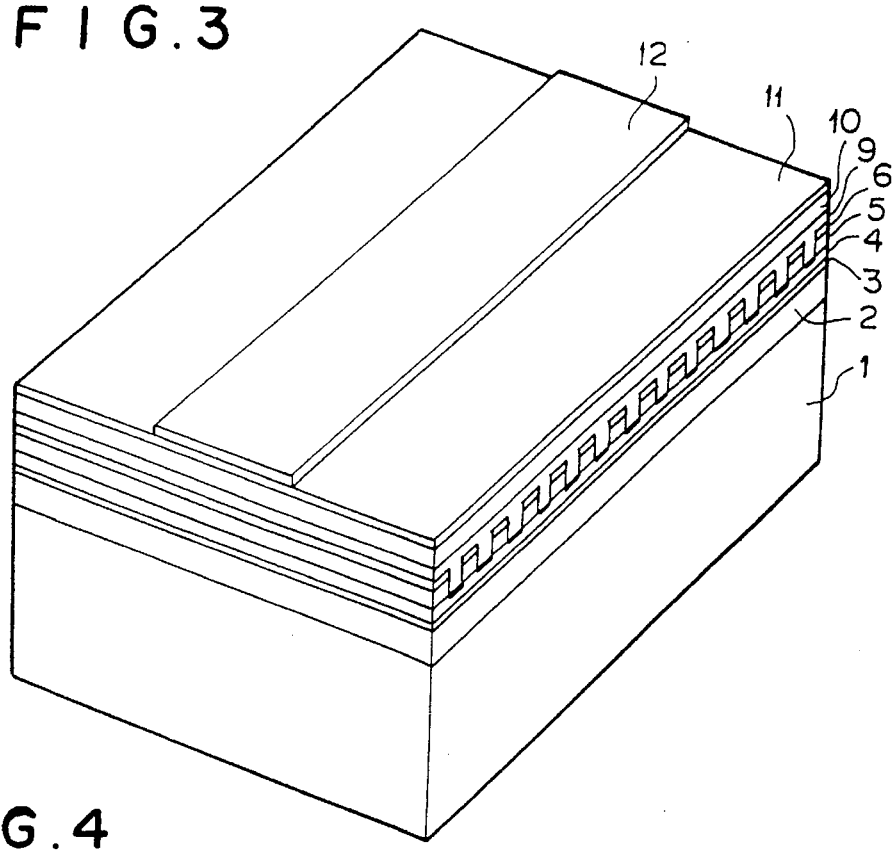
FIG. 3 is a schematic representation illustrating a step subsequent to the step shown in FIG. 2.

Upper layers will then be formed. As shown in FIG. 3, the resist 7 is completely removed, and a p-type AlGaInAsP optical waveguide layer 9 having a bandgap $E_{gG}$, a p-type AlGaInAsP cladding layer 10 having a bandgap $E_{gC}$, and a p-type GaAs contact layer 11 are successively grown on the lower layers by organometallic vapor phase epitaxy or molecular beam epitaxy. After an insulating film 12 has also been formed over the contact layer 11, this insulating film 12 is patterned, in the form of stripes having a width of about 4 μm, by an ordinary lithography technique.

Figure 4:
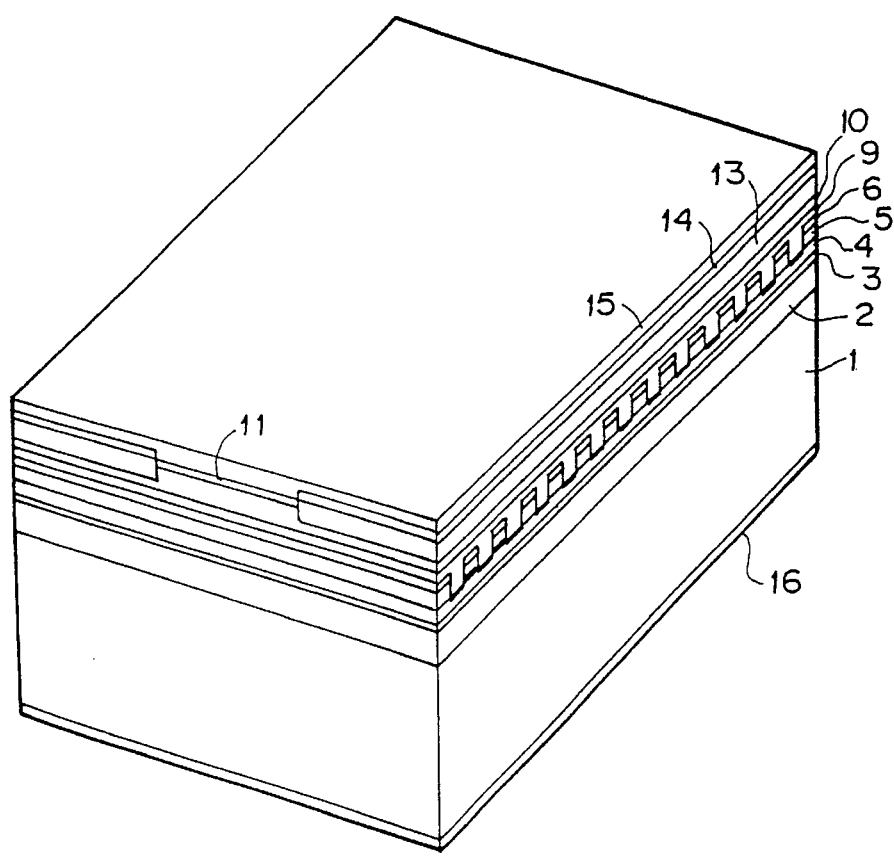
FIG. 4 is a schematic perspective view illustrating the DFB lasers, when it is finished.

To form an optical waveguide, as shown in FIG. 4, the layers are etched into the cladding layer 10 by dry etching using the insulating film 12, having a stripe width of about 4 μm, as a mask. An n-type AlGaInAsP buried layer 13 having a bandgap $E_{gB}$ is formed by the organometallic vapor phase epitaxy. An insulating film 14 is also formed over the buried layer 13, and the insulating film 14 is removed from any regions other than the buried layer 13 using the ordinary lithography technique. A p-side electrode 15 is then formed over the insulating film 14. Moreover, an n-side electrode 16 is formed on the back of the substrate 1. Thus, a DFB laser having an oscillation wavelength in the range of 740–1000 nm is obtained.

Figure 5:
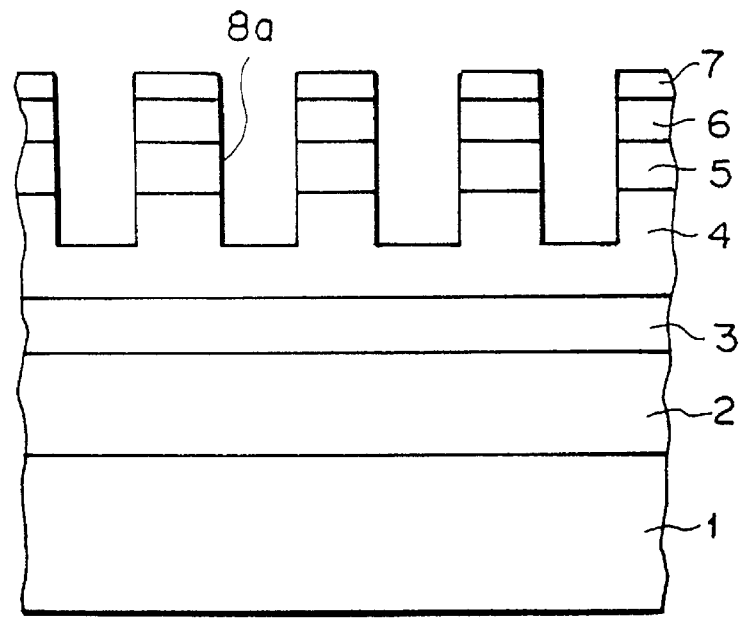
FIG. 5 is a side view illustrating the chief parts of the DFB laser when the laser is in the course of being manufactured.

As can be seen from an enlarged view of FIG. 5, when the diffraction gratings 8 are formed, trenches 8a that extend from the resist 7 into the carrier blocking layer 4 are formed. Therefore, the optical waveguide 5 and the carrier blocking layer 4 will be exposed to air at the sidewalls of the trenches 8a until crystals are regrown after this etching. As with some other layers, the optical waveguides 5 and the carrier blocking layer 4 include aluminum that is susceptible to oxidation.

However, in this embodiment, the optical waveguide layer 5 and the carrier blocking layer 4, both of which will be exposed to air, are formed of the five-element AlGaInAsP-based compound semiconductor that enables a semiconductor laser having superior characteristics to be formed, even when the content of aluminum is reduced (for example, the content of aluminum in the group III elements is less than 30%). Therefore, in this DFB laser, the oxidation of aluminum becomes less likely to occur. Accordingly, crystal defects resulting from the oxidation of aluminum at the time of crystal regrowth, are reduced, and it becomes possible to manufacture the DFB laser with high yield.

When the optical waveguide 5 and the carrier blocking layer 4 are formed from the AlGaInAsP-based compound semiconductor, the content of aluminum in the vicinity of the active layer 3 becomes less, and hence this DFB laser becomes highly reliable over a long period of time even when being subjected to high output oscillations.

In the previous embodiment, the n-type substrate is used, however, the present invention is similarly applicable to semiconductor lasers using a p-type substrate. A quantum well structure or a strained-layer quantum well structure may be applied to the active layer.

In addition, the present invention is not limited to the DFB laser, but is also applicable to other distributed reflection type lasers or optical integrated circuits partially including diffraction gratings. Another embodiment of the semiconductor laser according to this invention, which is applied to an optical integrated circuit as previously mentioned, will be described below.

Figure 6:
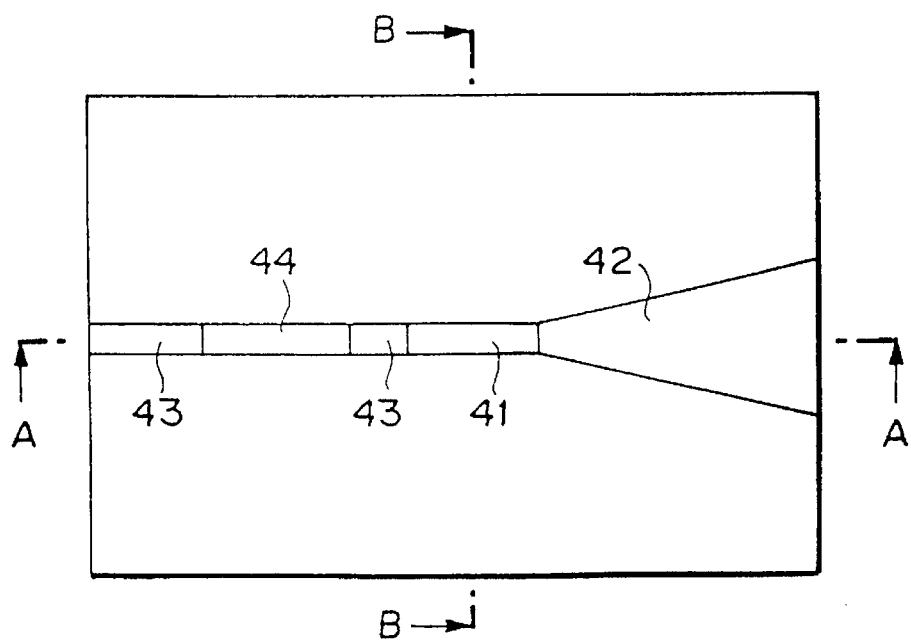
FIG. 6 is a plan view illustrating an optical integrated circuit according to a second embodiment of the present invention.
Figure 7:
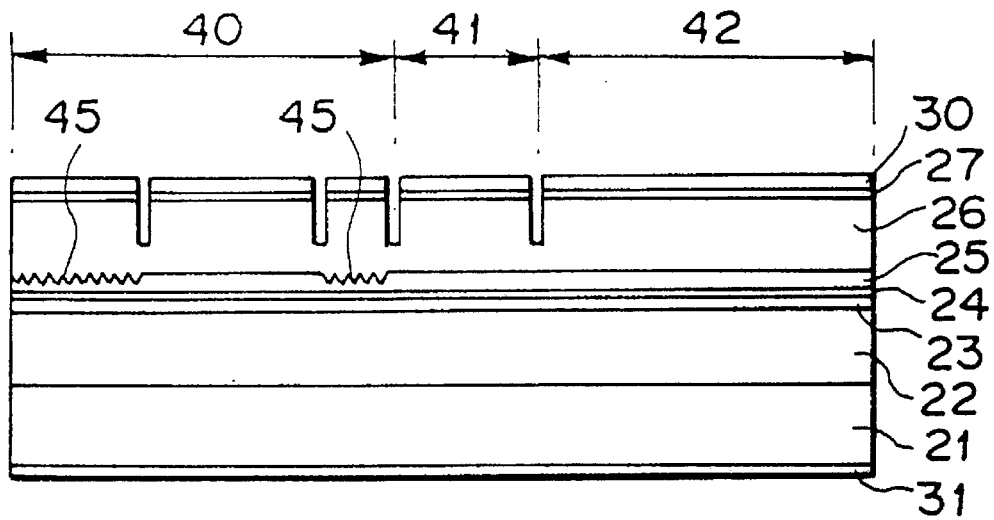
FIG. 7 is a cross-sectional view of the optical integrated circuit taken along a line A—A shown in FIG. 6.
Figure 8:
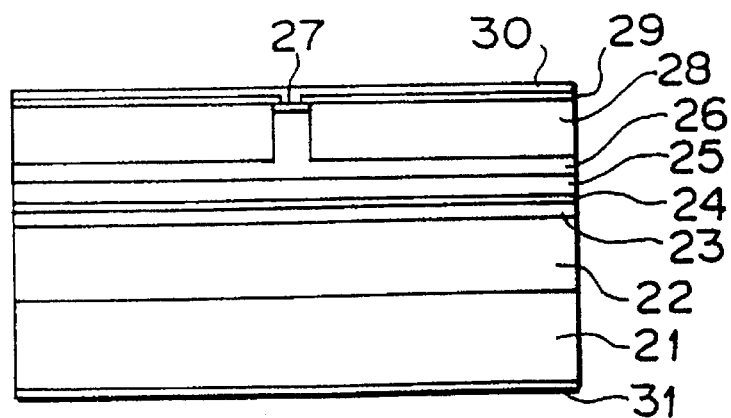
FIG. 8 is a cross-sectional view of the optical integrated circuit taken along a line B—B shown in FIG. 6.

Second Embodiment:

FIG. 6 shows a plane configuration of an optical integrated circuit according to a second embodiment. FIGS. 7 and 8 are cross-sectional views of the optical integrated circuit shown in FIG. 6 taken along lines A—A and B—B. Manufacturing steps of this optical integrated circuit will now be described.

An n-type AlGaInAsP cladding layer 22 having a bandgap $E_{gC}$, an n-type AlGaInAsP waveguide layer 23 having a bandgap $E_{gG}$ ($E_{gC} > E_{gG}$), an undoped GaInAsP active layer 24 having a bandgap $E_{gA}$ ($E_{gC} > E_{gA}$), and a p-type AlGaInAsP optical waveguide layer 25 having a bandgap $E_{gG}$ are successively grown on an n-type GaAs (100) 21 substrate by organometallic vapor phase epitaxy or molecular beam epitaxy.

After the lower layers 22–25 have been formed in the manner as mentioned above, diffraction gratings 45 having a predetermined period Λ, which is determined by an oscillation wavelength, are formed in predetermined regions of the optical waveguide layer 25 by the photolithography using ordinary interference exposure.

Upper layers will now be formed. Resist is first removed, and a p-type AlGaInAsP cladding layer 26 having a bandgap $E_{gC}$, and a p-type GaAs contact layer 27 are successively grown by the organometallic vapor phase epitaxy or the molecular beam epitaxy. After an insulating film has also been formed over the contact layer 27, this insulating film is patterned using ordinary lithography techniques. This pattern has a strip width of about 4 μm in a distributed Bragg reflector laser region 40 and an optical modulator region 41, and the pattern is formed into a tapered shape, which radially extends in the direction of the emission of light, in an optical amplifier region 42.

While this insulating film is used as a mask, the cladding layer 26 is etched into by dry etching, and an n-type AlGaInAsP buried layer 28 having a bandgap $E_{gB}$ ($E_{gB} > E_{gC}$) is formed by organometallic vapor phase epitaxy. An insulating film 29 is also formed over the buried layer 28, and the insulating film positioned at any regions other than the buried layer 28 is removed by the ordinary lithography technique. A p-side electrode 30 is formed over the insulating film 29.

Subsequently, this p-side electrode 30 is divided into subdivisions as shown in FIG. 7 so that currents will not interfere with each other between the optical modulator and the optical amplifier. In addition, in the distributed Bragg reflector type laser, the p-side electrode 30 is further separated into subdivisions between a Bragg reflection region 43, where diffraction gratings 45 are formed, and a gain region 44 in order to prevent the mutual interference of the regions 43 and 44. The cladding layer 26 is etched into using these p-side electrodes 30 as a mask. Thereafter, an n-side electrode 31 is formed on the back of the substrate 21. Through these steps, an optical integrated circuit having an oscillation wavelength of 740–1000 nm that consists of a distributed Bragg reflector laser, an optical modulator and an optical amplifier is manufactured.

Although the n-type AlGaInAsP buried layer 28 is formed in this embodiment, this layer may be omitted.

Even in this embodiment, the optical waveguide 25, which is exposed to air after the formation of the diffraction gratings 45 until the upper layers are formed, is formed of five-element AlGaInAsP-based compound semiconductor that enables a semiconductor laser having superior characteristics to be formed even when the content of aluminum is reduced. Hence, as with the previously explained embodiment, improved yield and reliability over a long period of time are obtained.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to those who are versed in the art.

What is claimed is:

1. A semiconductor device laser, comprising:
   a plurality of lower layers formed on a GaAs substrate by first stage of crystal growth;
   a plurality of spaced, parallel diffraction gratings formed by etching a plurality of trenches in an upper side of the lower layers to a predetermined depth; and
   a plurality of upper layers formed by regrowing crystals over the diffraction gratings,
   wherein the lower layers subjected to etching are composed of five-element AlGaInAsP-based compound semiconductor materials having an aluminum content of more than 0% and less than 30% in the group III elements, and wherein the lower layers further comprise an optical waveguide layer.

2. A semiconductor device as defined in claim 1, wherein the semiconductor device is a DFB laser.

3. A semiconductor device as defined in claim 1, wherein the semiconductor device is an optical integrated circuit.

* * * * *